United States Patent [19]

Stevens

[11] Patent Number: 4,949,183
[45] Date of Patent: Aug. 14, 1990

[54] IMAGE SENSOR HAVING MULTIPLE HORIZONTAL SHIFT REGISTERS

[75] Inventor: Eric G. Stevens, Rochester, N.Y.

[73] Assignee: Eastman Kodak Company, Rochester, N.Y.

[21] Appl. No.: 442,749

[22] Filed: Nov. 29, 1989

[51] Int. Cl.⁵ .................... H04N 3/14; H04N 5/335
[52] U.S. Cl. .................... 358/213.23; 358/213.29; 357/24; 377/58
[58] Field of Search .................... 358/213.23, 213.29; 357/24

[56] References Cited

U.S. PATENT DOCUMENTS

| 3,995,302 | 11/1976 | Amelio | 357/24 |
| 4,546,368 | 10/1985 | Yamanari | 357/24 |
| 4,580,155 | 4/1986 | Tsoi et al. | 357/24 |
| 4,750,042 | 6/1988 | Murayama et al. | 358/213.31 |
| 4,821,081 | 4/1989 | Hynecek | 377/58 |

Primary Examiner—James J. Groody
Assistant Examiner—W. Clements
Attorney, Agent, or Firm—Donald D. Schaper

[57] ABSTRACT

An image sensor is disclosed which comprises an imaging region and horizontal shift registers which receive charge carriers generated in the imaging region and transfer them to an output circuit for processing. In order to facilitate the transfer of charge carriers out of the sensor and to provide an image sensor which has a simplified structure, dual horizontal transfer registers are used and transfer of charge carriers between the two registers is accomplished without a separate transfer gate electrode.

15 Claims, 3 Drawing Sheets

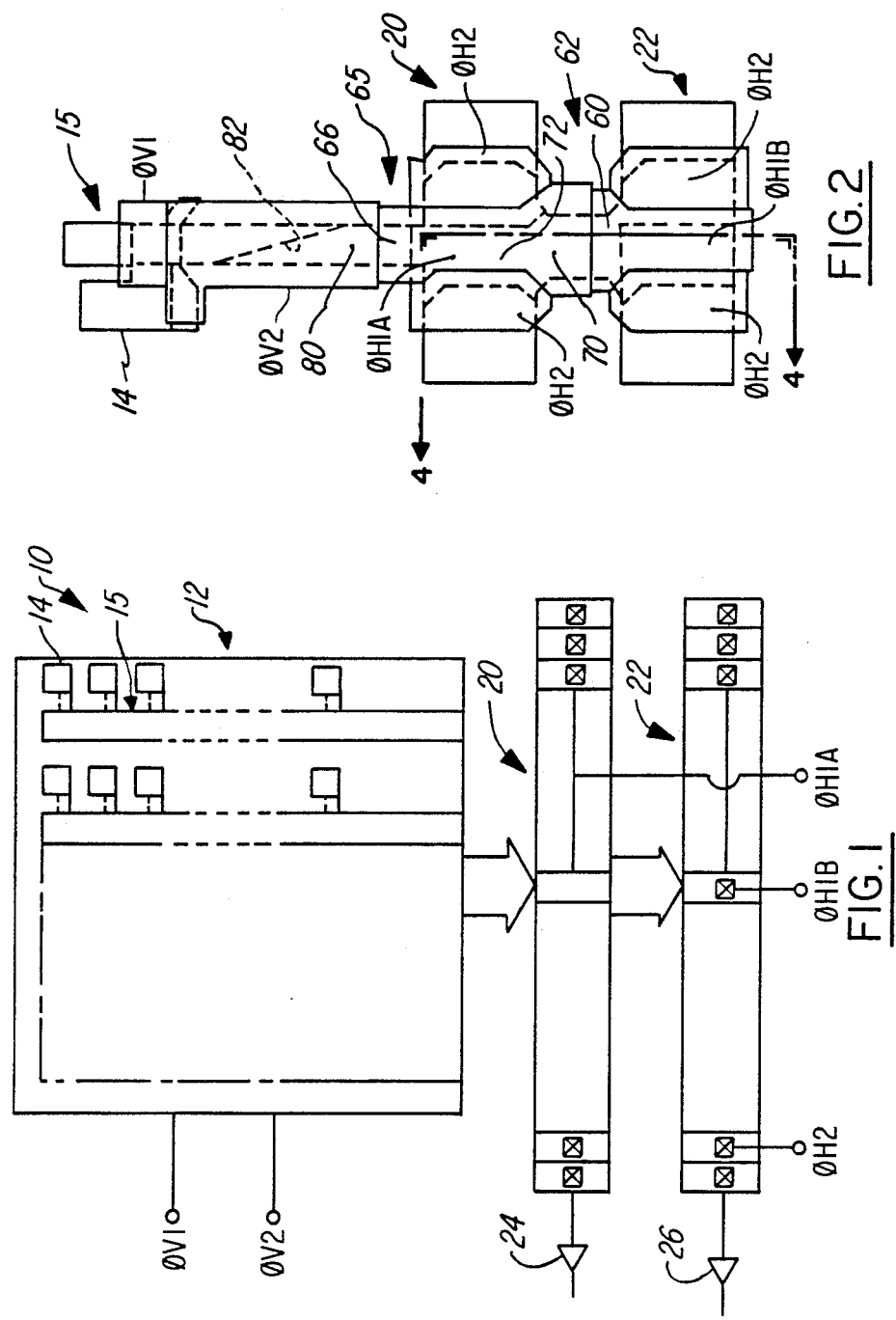

IMAGE SENSOR HAVING MULTIPLE HORIZONTAL SHIFT REGISTERS

BACKGROUND OF THE INVENTION

1. Field of the Invention

The present invention relates to an image sensor, and more particularly to an image sensor having dual horizontal transfer registers.

2. State of the Prior Art

Solid-state image sensor of the interline type normally include an array comprised of columns and rows of photodetectors. A so-called vertical shift register is located adjacent each of the columns of photodetectors, and charge carriers generated in the photodetectors are transferred to the vertical shift registers during each frame time. The entire detected image is then shifted down in unison and transferred to a horizontal shift register one line at a time. The horizontal shift register delivers the charge carriers in each line to signal processing circuitry before the next line is shifted in.

One of the problems in arrays of the type described above is to provide for a fast and efficient transfer of charge carriers from the photodetectors to the signal processing circuitry. One partial solution to this problem is to provide dual horizontal transfers, as shown, for example, in U.S. Pat. No. 4,750,042. The image sensor in this patent comprises a plurality of light-receiving elements arranged in a matrix, vertical CCD's for transferring charge carriers generated in the light-receiving elements out of the matrix, and two horizontal transfer registers connected to the image receiving portion through a transfer gate. The two horizontal transfer registers are connected in parallel with each other through a gate electrode so that charge carriers can be transferred from one register to the other. When both registers are full, the charge carriers are transferred to output circuitry by means of common clocking signals. A disadvantage of the image sensor shown in this patent is that separate gate electrodes are required between the two horizontal transfer registers. This makes the device more difficult to manufacture, and makes control of the device more difficult, since separate clocking signals must be provided to each of the gate electrodes.

SUMMARY OF THE INVENTION

It is an object of th present invention to overcome the problems in the prior art discussed above and to provide an improved image sensor.

In accordance with the present invention, there is provided an image sensor comprising: an imaging region which include a substrate of semiconductor material, the region including means for accumulating charge carriers and for transferring the charge carriers from the region; at least two shift registers arranged in a side-by-side relationship adjacent the region, the shift registers being adapted to receive charge carriers from the region; means for controlling the transfer of charge carriers from one shift register to the other shift register, the controlling means comprising a barrier implant formed in the semiconductor material between the shift registers; means for effecting the transfer of charge carriers from the one shift register to the other shift register; and means for clocking the shift registers to transfer the charge packets from the registers to an output circuit.

In one embodiment of the present invention, the image sensor comprises an imaging region which includes a matrix of photosensitive elements for accumulating charge carriers and columns of CCD's for transferring charge carriers out of the imaging region. The charge carriers are transferred to two horizontal shift registers which are adapted to transfer the charge carriers to an output circuit. The two shift registers are connected such that a row of charge carriers can be shifted between the two registers by means of a gate structure which is formed as a contiguous part of the gate electrode of one of the registers.

One of the main advantages of the present invention over known area sensors is that the gate electrodes are eliminated between the imaging region and the horizontal shift register and between the two horizontal shift registers. The transfer of charge carriers between registers is accomplished by means of a transfer gate which includes a relatively wide transfer region and a barrier implant in the transfer region. The wide transfer region functions to eliminate potential barrier caused by narrow-channel effects. The present invention can be employed with both interline and full-frame architectures as well as other architectures.

Other features and advantages will become apparent upon reference to the following description of the preferred embodiment when read in light of the attached drawings.

BRIEF DESCRIPTION OF THE DRAWINGS

FIG. 1 is a plan view of the image sensor of the present invention;

FIG. 2 is an enlarged plan view of a portion of the horizontal shift register;

DESCRIPTION OF THE PREFERRED EMBODIMENTS

Figure 3:
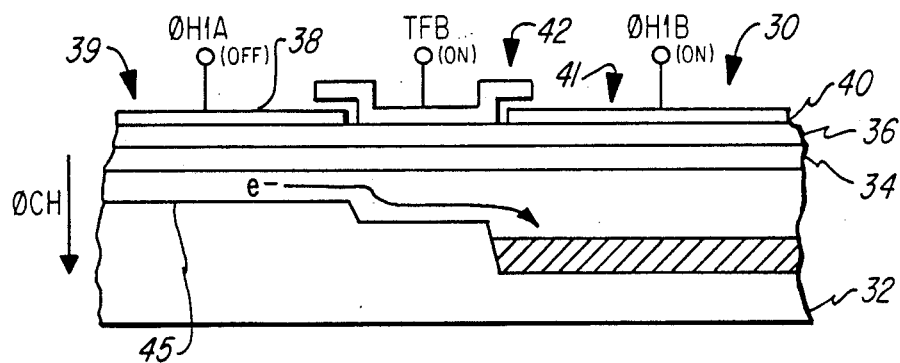
FIG. 3 is a cross section of a prior-art device.

With reference to FIG. 1, there is shown an image sensor 10 which is constructed in accordance with the present invention. Image sensor 10 comprises an imaging region 12 which includes photosensitive elements 14 arranged in columns and rows. Adjacent each column of elements 14 is a vertical shift register 15 for receiving charge carriers from the elements 14 and transferring the charge carriers out of the imaging region 12. The charge carriers are transferred from region 12 to two horizontal shift registers 20 and 22. Shift registers 15, 20, and 22 are charge-coupled devices (CCD's). As will be explained in more detail hereinafter, charge carriers from imaging region 12 are transferred into register 20, one row at a time. From registr 20, the row of charge carriers can be shifted into register 22 so that another row of charge carriers an be shifted into register 20. When both registers 20 and 22 are full, the charge carriers can be shifted out ot an output circuit (not shown) through buffer amplifiers 24 and 26.

In FIG. 3, a prior-art arrangement is shown for transferring charge carriers between shift registers. A device 30 in FIG. 3 comprises a p-type substrate 32 which has an N-type buried channel 34 formed therein. A silicon dioxide insulating layer 36 is formed on substrate 32. An electrode 38 of a CCD in a first register 39 is shown at one side of device 30, and an electrode 40 of a CCD in a second register 41 is shown at an opposite side of device 30. Between electrodes 38 and 40 is a gate electrode 42. In the transfer of charge carriers from a CCD in the first register 39 to a CCD in the second register 41, electrode 38 is off, and electrodes 40 and 42 are turned on. A potential profile 45 produced in device 30 during the transfer of charge carriers $e^{31}$ is shown in FIG. 3. The channel potential, $\phi$CH, increases in the direction of the arrow. A disadvantage of this type of device is, as noted above, the necessity to provide the separate gate electrode 42 and a clocking signal to the electrode 42 in order to achieve a transfer of charge carriers from one register to the other.

Figure 4:
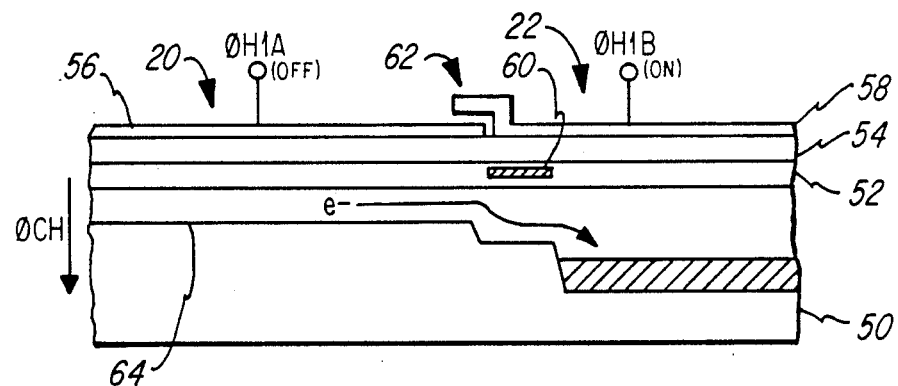
FIG. 4 is a cross section taken along the line 4—4 in FIG. 2.

In FIG. 4, there is shown a cross section through registers 20 and 22 in image sensor 10. As shown in FIG. 4, a substrate 50 includes a buried channel 52. Substrate 50 can be, for example, a p-type material, and buried channel 52 can be an n-type material. An insulating layer 54 is formed on substrate 50. An electrode 56 in register 20 and an electrode 58 in register 22 are formed over the insulating layer 54. Electrodes 56 and 58 can be formed, for example, from polysilicon. A p-type barrier implant 60 is formed in buried channel 52 to form a transfer gate 62 which functions with electrode 58. Such an arrangement eliminates the need for a separate transfer-gate electrode as shown in the prior-art device in FIG. 3. A potential profile 64 is shown in FIG. 4 for transferring charge carriers from register 20 to register 22. The potential profile 64 is produced when the voltage to electrode 56 is turned off and the voltage to electrode 58 is turned on. The arrangement shown in FIG. 4 is a true two-phase CCD process.

Charge carriers are transferred from a vertical regisster 15 in imaging region 12 to register 20 through a transfer gate 65 (FIGS. 2 and 7) of a type similar to transfer gate 62. A barrier implant 66 and electrode 56 function in the same manner as implant 60 and electrode 58. As a result of this structure, a gate electrode for this transfer gate is not needed. As shown in FIG. 2, register 15 includes an elongated storage region 80 adjacent register 20. Storage region 80 has been made elongated to accommodate a wide bus bar (not shown). In order to provide for an efficient transfer of charge carriers from storage region 80, a tapered barrier implant 82 has been formed in region 80. The tapered barrier implant 82 results in an electric field providing field-aided drift of the charge carriers. Field-aided drift of the charge carriers. Field-aided drift is a faster transport mechanism than the thermal diffusion process typically encountered in devices having long gate electrodes. The charge capacity of each register 20 and 22 is twice that of the vertical registers 15, and thus, a 2×1 charge aggregation can be performed, if desirable. The charge capacity of a storage region in vertical register 15 can be, for example, 50,000 $e^{31}$.

An important feature in the disclosed means for transferring charge carriers from register 20 to register 22 is shown in FIG. 2. As shown in this figure, a transfer region 70 between registers 20 and 22 is made wider than an adjacent storage region 72 in register 20. If the width of the transfer region 70 were made less than storage region 72, a potential barrier would exist between storage region 72 and transfer region 70. Such a potential barrier is caused by three factors. Two of the factors have to do with the definition of the channel stops (not shown). During growth of the local field isolation for the channel stops, the "bird's beak" and boron encroach into the active channel region, thereby effectively reducing its width. These factors combine with the third factor, the electrostatic effect, to form the potential barrier. As a result of making the region 70 wider, the potential barrier is eliminated, and the an efficient transfer of charge carriers can be accomplished.

Figure 5:
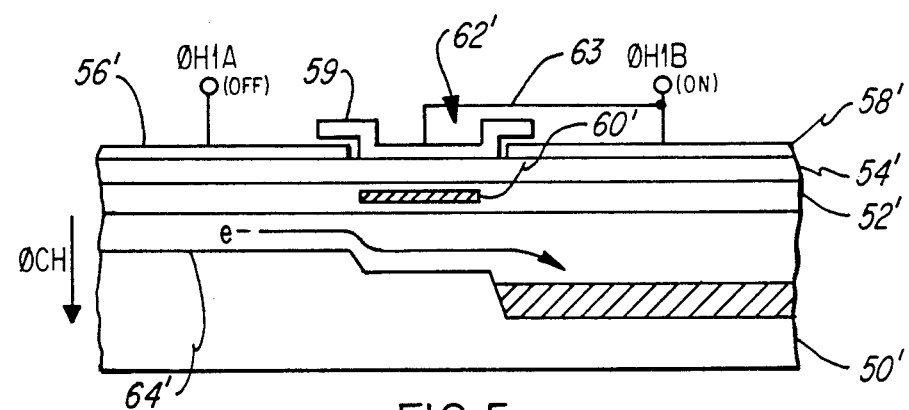
FIG. 5 is a cross section of another embodiment of the present invention.

In FIG. 5, there is shown an arrangement which is generally similar to the arrangment in FIG. 4, except that, instead of being a true two-phase process, it is a pseudo two-phase process. In the embodiment shown in FIG. 5, a buried channel 52' is formed in a p-type substrate 50'. An insulation layer 54' is formed on substrate 50, and electrodes 56' and 58' in two side-by-side registers (not shown) are formed on layer 54'. A transfer gate 62' is formed between electrodes 56' and 58' by a separate polysilicon layer 59 and p-type barrier implant 60' placed in buried channel 52'. Implant 60' is located under layer 59. Electrode 58' and layer 59 are tied together electrically by means of a connection 63. A potential profile 64' is produced in the embodiment shown in FIG. 5 when electorde 56' is off and electrode 58' is on.

Figure 6:
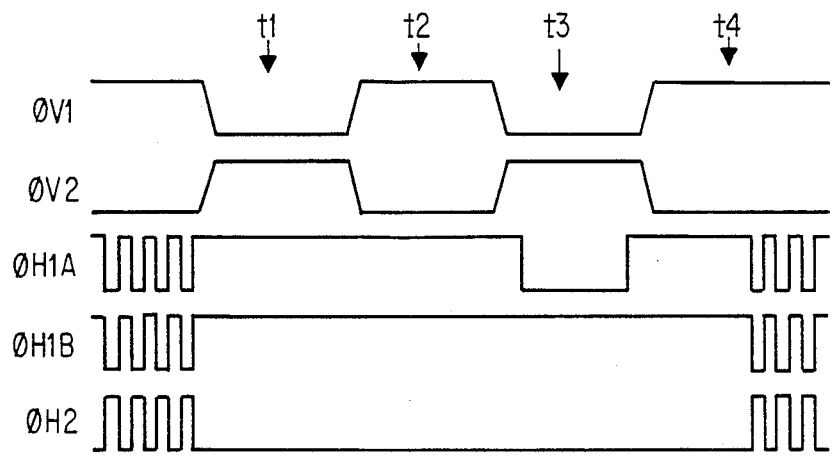
FIG. 6 is a timing diagram showing the sequence of signals provided to the image sensor to transfer charge carriers into the horizontal shift registers and between the registers.
Figure 7:
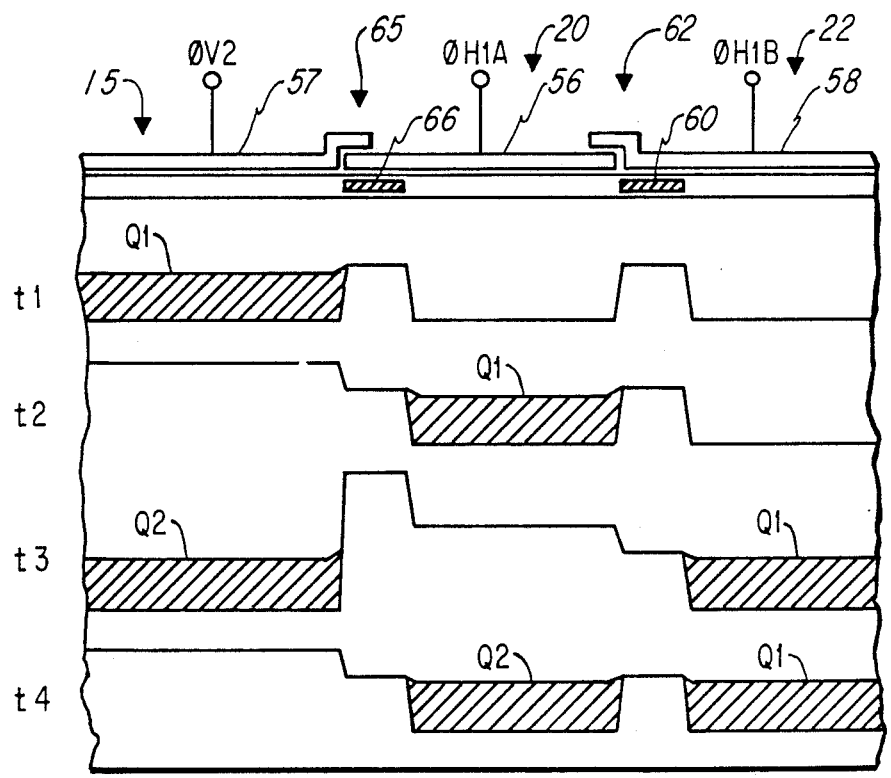
FIG. 7 is a schematic diagram showing the transfer of charge carriers between the imaging region and the horizontal shift registers and between the shift registers.

The transfer of charge carriers to registers 20 and 22 and between the two registers can be illustrated with reference to FIGS. 6 and 7. In FIG. 6, there is shown a timing diagram of the signals provided to sensor 10 for the transfer of charge carriers from imaging region 12 to register 20 and from register 20 to register 22. In FIG. 7, the transfer of the charge carriers is illustrated for times $t_1-t_4$. In FIG. 6, $\phi$V1 and $\phi$V2 represent clock signals to a vertical CCD register 15 in the imaging region 12, and $\phi$H1A, $\phi$H1B, and $\phi$H2 represent clock signals to the registers 20 and 22. Thus, at time $t_1$, $\phi$V1 and $\phi$H2 are low, $\phi$V2, $\phi$H1A, $\phi$H1B are high, and a charge carrier packet $Q_1$ is moved under a gate electrode 57 in the vertical shift register 15. At time $t_2$, $\phi$V2 goes low, and charge carrier packet $Q_1$ is moved under electrode 56 in register 20. At time $t_3$, $\phi$V2 goes high, $\phi$H1A goes low, charge carrier packet $Q_1$ is moved under electrode 58 in register 22, and a new charge carrier pakcet $Q_2$ is moved under electrode 57. At time $t_4$, $\phi$V2 goes low, and charge carrier packet $Q_2$ is moved under electrode 56. After time $t_4$, $\phi$H1A, $\phi$H1B, $\phi$H2 are cycled as shwon to move the charge carrier packets $Q_1$ and $Q_2$ out of thee registers 20 and 22. It is important to note that $\phi$H1A and $\phi$H1B are clocked in unison during this time and that the potential barrier created by implant 60 maintains the separation of charge packets $Q_1$ and $Q_2$.

The arrangement of horizontal registers disclosed herein can be used for parallel readout of two complete lines of signal charge at data rates in excess of 30 frames per second. A single channel readout mode can also be used if desired, since each horizontal register has enough pixels to contain a full line of information from the imaging region. As a result of eliminating the separate transfer gate between the horizontal registers in image sensor 10, only three clocks are required to operate both registers. It will be apparent to those skilled in the art that the principles of the present invention could be used in a device having more than two horizontal registers.

The invention has been described in detail with particular reference to the preferred embodiments thereof, but it will be understood that variations and modifications can be effected within the spirit and scope of the invention.

I claim:

1. An image sensor comprising:
   an imaging region which includes a substrate of semiconductor material, said region including means in said material for accumulating charge carriers and for transferring said charge carriers from said region;
   at least two shift registers arranged in a side-by-side relationship adjacent said region, said shift registers being adapted to receive charge carriers from said region;
   means for controlling the transfer of charge carriers from one shift register to the other shift register, said controlling means comprising a barrier implant formed in said semiconductor material between said shift registers;
   means for effectig the transfer of charge carriers from said one shift register to the other shift register; and
   means for clocking said shift registers to transfer said charge packets from said registers to an output circuit.

2. An image sensor, as defined in claim 1, wherein said one register is a CCD shift register which includes a series of storage regions for receiving charge carriers from said region.

3. An image sensor, as defined in claim 2, wherein said controlling means includes a transfer region adjacent to each of said storage regions, and said transfer regions are wider than said storage regions.

4. An image sensor, as defined in claim 1, wherein said shift registers are clocked in unison to transfer said charge packets from said registers to an output circuit.

5. An image sensor, as defined in claim 1, wherein said means for accumulating and transferring charge carriers includes a matrix of photoelectric conversion elements.

6. An image sensor, as defined in claim 5, wherein said means for accumulating and transferring charge carriers includes columns of CCD shift registers which receive charge carriers from said elements.

7. An image sensor, ad defined in claim 1, wherein said shift registers are CCD shift registers.

8. An image sensor, as defined in claim 1, wherein said barrier implant is a p-type material.

9. An image sensor, as defined in claim 1, wherein said effecting means includes an electrode in said other register.

10. An image sensor, as defined in claim 1, wherein an electrode in said other register extends over said barrier implant.

11. An image sensor, as defined in claim 1, wherein said controlling means includes a separate conductive layer between said registers, and said separate conductive layer is connected electrically to an electrode in said other register.

12. An image sensor comprising:
    an imaging region which includes a substrate of semiconductor material, said region including means in said material for accumulating charge carriers and for transferring said charge carriers from said region;
    at least two CCD shift registers arranged in a side-by-side relationship adjacent said region, a first shift register having a series of storage regions for receiving charge carriers from said region and a second shift register which is adapted to received charge carriers from said storage regions in said first shift register;
    means for controlling the transfer of charge carriers from said first shift register to the second shift register, said controlling means comprising a transfer region in said semiconductor material adjacent each of said storage regions, each of said storage regions including a barrier implant therein;
    means for effecting the transfer of charge carriers from said frist shift register to the second shift register; and
    means for clocking said shift registers in unison to transfer said charge packets from said registers to an output circuit.

13. An image sensor, as defined in claim 12, wherein each of said transfer regions is wider than an adjacent storage region.

14. An image sensor, as defined in claim 13, wherein a transfer gate in a storage region between said imaging region and said first register includes a second barrier implant.

15. An image sensor, as defined in claim 14, wherein an elongated storage region in said imaging region is defined at its ends by said second barrier implant and a tapered barrier implant.

* * * * *

UNITED STATES PATENT AND TRADEMARK OFFICE
CERTIFICATE OF CORRECTION

PATENT NO. : 4,949,183
DATED : August 14, 1990
INVENTOR(S) : Eric G. Stevens

It is certified that error appears in the above-identified patent and that said Letters Patent is hereby corrected as shown below:

Column 1, line 11, "sensor" should read -- sensors --;
  line 26, "transfers" should read -- transfer registers --;
  line 47, "th" should read -- the --; and line 52, "include" should read -- includes --.
Column 2, line 14, "register" should read -- registers --;
  line 19, "barrier" should read -- barriers --; line 33, "register" should read -- registers --; line 65, "an" should read -- can --; and line 67, "ot" should read -- to --.
Column 3, line 14, "e31" should read -- e---, line 41, "teer" should read -- ter --; lines 54 and 55, delete "Field-aided drift of the charge carriers"; and line 62, "e31" should read -- e- --.
Column 4, line 11, "the" (second occurrence) should read -- thus --; line 49, "pakcet" should read -- packet --; line 52, "shwon" should read -- shown --; and line 53, "thee" should read -- the --.
Column 5, line 49, "ad" should read -- as --.
Column 6, line 24, "received" should read -- receive --;
  line 31, "storage" should read -- transfer --; and
  line 34, "frist" should read -- first --.

Signed and Sealed this

Seventh Day of January, 1992

Attest:

HARRY F. MANBECK, JR.

*Attesting Officer*   Commissioner of Patents and Trademarks